(12) United States Patent
Selvanayagam et al.

(10) Patent No.: US 9,506,823 B2
(45) Date of Patent: Nov. 29, 2016

(54) BONDING STRESS TESTING ARRANGEMENT AND METHOD OF DETERMINING STRESS

(75) Inventors: Cheryl Sharmani Selvanayagam, Singapore (SG); Xiaowu Zhang, Singapore (SG); Tai Chong Chai, Singapore (SG); Alastair David Trigg, Singapore (SG); Cheng Kuo Cheng, Singapore (SG); Xian Tong Chen, Singapore (SG); Kripesh Vaidyanathan, Singapore (SG)

(73) Assignee: Agency for Science, Technology and Research, Singapore (SG)

( * ) Notice: Subject to any disclaimer, the term of this patent is extended or adjusted under 35 U.S.C. 154(b) by 790 days.

(21) Appl. No.: 13/696,432

(22) PCT Filed: May 3, 2011

(86) PCT No.: PCT/SG2011/000168
§ 371 (c)(1),
(2), (4) Date: Apr. 15, 2013

(87) PCT Pub. No.: WO2011/139231
PCT Pub. Date: Nov. 10, 2011

(65) Prior Publication Data
US 2013/0199303 A1    Aug. 8, 2013

(30) Foreign Application Priority Data
May 7, 2010    (SG) .................... 201003260-5

(51) Int. Cl.
*G01L 1/22*    (2006.01)
*H01L 21/66*    (2006.01)

(52) U.S. Cl.
CPC ............... *G01L 1/22* (2013.01); *H01L 22/12* (2013.01); *H01L 22/34* (2013.01); *H01L 2924/0002* (2013.01)

(58) Field of Classification Search
CPC .................................................. G01L 1/22
USPC .................................................. 73/767
See application file for complete search history.

(56) References Cited

U.S. PATENT DOCUMENTS 4,884,051 A * 11/1989 Takahashi ............... G01L 5/162
                                                          257/417
6,486,051 B1 * 11/2002 Sabin et al. ................. 438/612

(Continued)

OTHER PUBLICATIONS

Chylak, Developments in Fine Pitch Copper Wire Bonding Production, Proceedings 11th Electronics Packaging Technology Conference, 1 (2009).

(Continued)

*Primary Examiner* — Lisa Caputo
*Assistant Examiner* — Octavia Hollington
(74) *Attorney, Agent, or Firm* — K. David Crockett, Esq.; Niky Economy Syrengelas, Esq.; Crockett & Crockett, PC

(57) ABSTRACT

A bonding stress testing arrangement and a method of determining stress are provided. The bonding stress testing arrangement includes at least one bond pad; a sensor assembly comprising any one of a first sensor arrangement, a second sensor arrangement and a combination of the first sensor arrangement and the second sensor arrangement; wherein the first sensor arrangement is adapted to measure an average stress on a portion of a bonding area under the at least one bond pad, and the second sensor arrangement is adapted to determine stress distribution over a portion or an entire of the bonding area under the at least one bond pad.

31 Claims, 11 Drawing Sheets

(56) References Cited

U.S. PATENT DOCUMENTS

| | | | | |
|---|---|---|---|---|
| 8,803,145 | B2* | 8/2014 | Patti et al. | 257/48 |
| 2008/0246491 | A1* | 10/2008 | Ogawa | G01R 31/2853 324/519 |

OTHER PUBLICATIONS

Vath, et al., Factors Affecting the Long Term Stability of Cu/Al Ball Bonds Subjected to Standard and Extended HTS, Proceedings 11th Electronics Packaging Technology Conference, 374 (2009).

Fiori, et al., 3D Multi-Scale Modeling of Wire Bonding Induced Peeling in Cu/Low-K Interconnects: Application of an Energy Based Criteria and Correlations with Experiments, Electronic Components and Technology Conference, 256 (2007).

Mayer, et al., Measuring Stress Next to Au Ball Bond During High Temperature Aging, 49 Microelectronics Reliability, 771 (2009).

Shah, et al., Online Methods to Measure Breaking Force of Bonding Wire using a CMOS Stress Sensor and a Proximity Sensor, 148 Sensor and Actuators A: Physical, 462 (2008).

Shah, et al., In situ Ultrasonic Force Signals During Low-Temperature Thermosonic Copper Wire Bonding, 85 Microelectronic Engineering, 1851 (2008).

Shah, et al., Optimisation of Ultrasound and Bond Force to Reduce Pad Stress in Thermosonic Cu Ball Bonding, Proceedings 11th Electronics Packaging Technology Conference, (2009).

Mayer, et al., In-situ Measurement of Stress and Temperature under Bonding Pads During Wire Bonding Using Integrated Microsensors, Proceedings 2nd Int. Conf. Emerging Microelectr. And Intercom. Tech., 129 (1998).

Suhling, et al., Silicon Piezoresistive Stress Sensors and Their Application in Electronic Packaging, 1 IEEE Sensors Journal, 14 (2001).

Miura, et al., Development and Application of the Stress Sensing Test Chip for IC Plastic Packages, Proceedings of the 64th Annual Meeting of the Jap. Soc. of Mech., 1826 (1987).

Doelle, et.al, Piezo-FET Stress-Sensor Arrays for Wire-Bonding Characterization, 15 Journal of Microelectromechanical Systems, 120 (2006).

Schwizer, et al., Force Sensors for Microelectronic Packaging Applications, Springer, 37 (2005).

Zou, et al., In-Situ Stress State Measurements During Chip-on-Board Assembly, 22 IEEE Transactions on Electronics Packaging and Manufacturing, 38 (1999).

Hizukuri, et al., Dynamic Strain and Chip Damage during Ultrasonic Flip Chip Bonding, 40 Japanese Journal of Applied Physics, 3044 (2001).

* cited by examiner

BONDING STRESS TESTING ARRANGEMENT AND METHOD OF DETERMINING STRESS

TECHNICAL FIELD

Various embodiments relate generally to a bonding stress testing arrangement and a method of determining stress.

BACKGROUND

During touch-down and ultrasonic bonding stages of wirebonding, high stresses are applied onto a bond pad so that a good joint between a bonding wire and the bond pad may be achieved. However, these high stresses may cause pad damage, silicon cratering, and aluminium splash where the thickness of the aluminum at the center of the pad is squeezed to the sides. These factors may result in poor bond quality.

With the trend towards miniaturisation in the electronics industry, the bonding wire is getting thinner, the bond pad space is getting narrower and the bond pad size is being shrunk. This means that a larger percentage of the bond pad area is experiencing a large stress. Further, the trend towards copper low-K (e.g. low dielectric constant) and ultra low-K also poses a challenge as the materials are soft and brittle. Wirebonding has been found to cause cracking and delamination in the low-K layers. The above mentioned problems may be further worsened with copper wire bonding rather than gold wire bonding as copper is harder than gold. Mechanical simulation shows that the stresses on the pad are much higher with copper wire than with gold wire.

These failures due to high stresses can be reduced if bonding parameters such as the free air ball shape, touch-down force and durations as well as ultrasonic energy and duration are optimized with knowledge of the stress state under the bond pad. Capillary shape also plays a role in determining the shape and the strength of the bond and the stress induced on the bond pad. Capillary design can also be optimized taking into account the stresses induced on the bond pad.

Measuring and mapping the stress distribution under the bond pad and correlating these to the failure mechanisms of wirebonding will allow easier determination of process parameters and improved capillary designs such that failures such as silicon cratering, aluminium splash and low-K cracking can be avoided and more robust wirebonds can be formed. Conventional methods to measure the stress distribution under the bond pad may involve mechanical simulation for extrapolation of stress from the measured regions to the unmeasured regions.

One conventional method is to place four n-type piezoresistive sensors arranged in a Wheatstone bridge configuration at the corners of bond pads [1-4]. All four sensors are aligned along the same crystallographic direction. With this configuration, there is a single output signal which corresponds to a stress component $\sigma_{xy}$. The stress component $\sigma_{xy}$ is a shear stress. The subscript x of the stress component $\sigma_{xy}$ represents the direction normal to the surface upon which the stress acts upon. The subscript y of the stress component $\sigma_{xy}$ represents the direction of the stress itself. Finite element modeling is then used to correlate $\sigma_{xy}$ to another stress component $\sigma_z$. The stress component $\sigma_z$ is a normal stress. The subscript z of the stress component $\sigma_z$ represents the surface on which the stress acts. However, this method determines only one component of stress which is the shear stress outside the pads. This method does not take stress measurement under the pad where failure usually occurs. Further, one assumption made using this method is that all four resistors have the same resistance which is highly unlikely given current fabrication methods.

Another conventional method includes placing single line n-type sensor across the center of bond pad and serpentine n-type sensor over the entire bond pad area [5]. However, this method measures bond force and shows that bond force has a linear relationship with resistance change. This method does not measure stress under the bond pad.

SUMMARY

According to one embodiment, a bonding stress testing arrangement is provided. The bonding stress testing arrangement includes at least one bond pad; a sensor assembly comprising any one of a first sensor arrangement, a second sensor arrangement and a combination of the first sensor arrangement and the second sensor arrangement; wherein the first sensor arrangement is adapted to measure an average stress on a portion of a bonding area under the at least one bond pad, and the second sensor arrangement is adapted to determine stress distribution over a portion or an entire of the bonding area under the at least one bond pad.

According to another embodiment, a method of determining stress on a portion of a bonding area under at least one bond pad is provided. The method includes any one of measuring an average stress on a portion of a bonding area under the at least one bond pad, and determining stress distribution over a portion or an entire of the bonding area under the at least one bond pad.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION

Embodiments of a bonding stress testing arrangement and a method of determining stress will be described in detail below with reference to the accompanying figures. It will be appreciated that the embodiments described below can be modified in various aspects without changing the essence of the invention.

Figure 1:
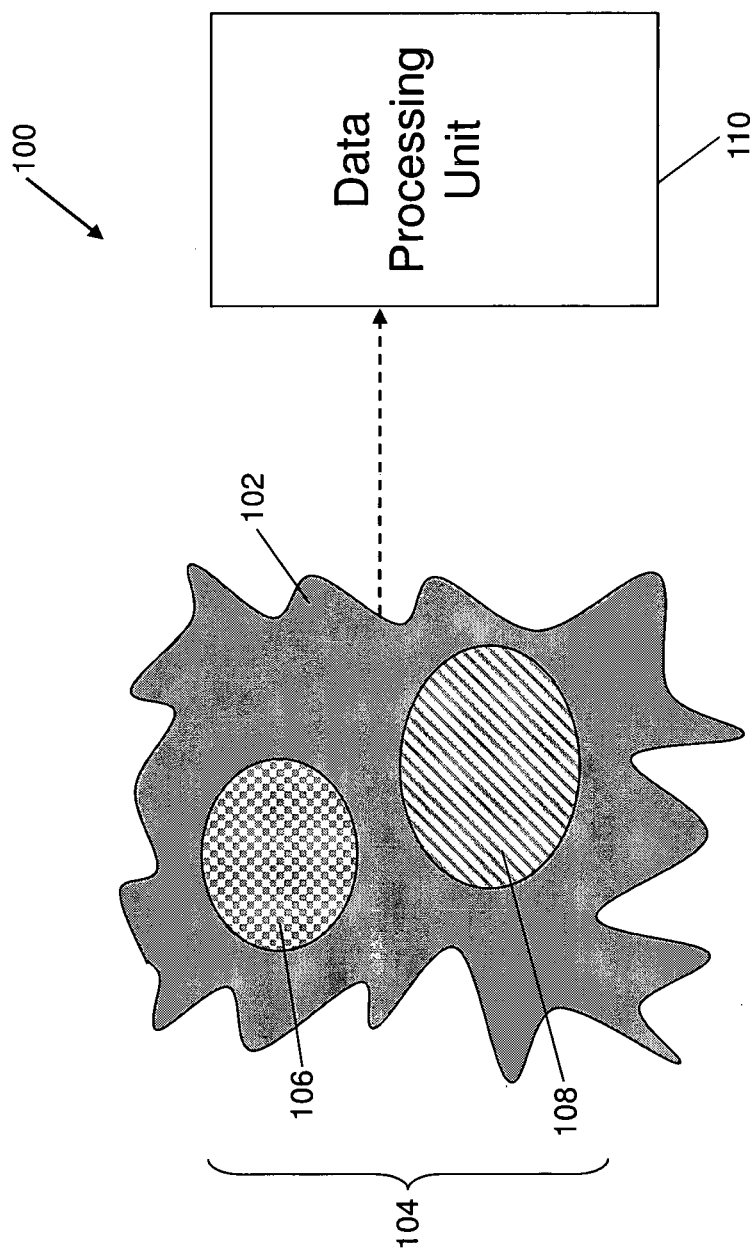
FIG. 1 shows a schematic diagram of a bonding stress testing arrangement according to one embodiment.

FIG. 1 shows a schematic diagram of a bonding stress testing arrangement 100. The bonding stress testing arrangement 100 includes at least one bond pad 102 and a sensor assembly 104. In one embodiment, the sensor assembly 104 may include a first sensor arrangement 106. In another embodiment, the sensor assembly 104 may include a second sensor arrangement 108. In yet another embodiment, the sensor assembly 104 may include a combination of the first sensor arrangement 106 and the second sensor arrangement 108.

For illustration purposes, FIG. 1 shows that the sensor assembly 104 includes a combination of the first sensor arrangement 106 and the second sensor arrangement 108. In one embodiment, the first sensor arrangement 106 and the second sensor arrangement 108 may be disposed on the same bond pad 102. In another embodiment, the first sensor arrangement 106 and the second sensor arrangement 108 may be disposed on different bond pads 102.

The first sensor arrangement 106 and the second sensor arrangement 108 may include a plurality of sensors respectively. In one embodiment, the number of sensors of the first sensor arrangement 106 and the number of sensors of the second sensor arrangement 108 may be the same. In another embodiment, the number of sensors of the first sensor arrangement 106 and the number of sensors of the second sensor arrangement 108 may be different. The plurality of sensors may be silicon-based piezoresistive stress sensors or resistors. The first sensor arrangement 106 is adapted to measure an average stress on a portion of a bonding area under the at least one bond pad 102. The second sensor arrangement 108 is adapted to determine stress distribution over a portion or an entire of the bonding area under the at least one bond pad 102.

In one embodiment, the bonding stress testing arrangement 100 may be a wirebonding test chip that uses the various piezoresistive stress sensors to determine the bulk and localised stresses below the bond pad 102. The wirebonding test chip may measure stress components under the bond pad 102 so that the stresses can be correlated with failure mechanism of the wirebond. A complete picture of what causes the failure of wirebonds may be provided. The wirebonding test chip may contain structures to allow the real-time measurement of four components of stress ($\sigma_x$, $\sigma_y$, $\sigma_z$, $\sigma_{xy}$). The stress components $\sigma_x$, $\sigma_y$, $\sigma_z$ are normal stress. The subscript x of the stress component $\sigma_x$ represents the surface on which the stress acts. The subscript y of the stress component $\sigma_y$ represents the surface on which the stress acts. The subscript z of the stress component $\sigma_z$ represents the surface on which the stress acts. The subscript x of the stress component $\sigma_{xy}$ represents the surface on which the stress acts. The stress component $\sigma_{xy}$ is a shear stress. The subscript y of the stress component $\sigma_{xy}$ represents the direction of the stress acting on the surface. The four components of stress ($\sigma_x$, $\sigma_y$, $\sigma_z$, $\sigma_{xy}$) may represent a stress distribution. The wirebonding test chip may contain two types of sensors, namely large area sensors (e.g. first sensor arrangement 106) which allow the measurement of average stresses in silicon under the bond pad 102, and miniaturized sensors (e.g. second sensor arrangement 108) which allow for the mapping of stress distribution in the area below the bond pad 102.

In one embodiment, the bonding stress testing arrangement 100 may further include a data processing unit 110 adapted to collect data representing values of the respective components of stress from the first sensor arrangement 106 and the second sensor arrangement 108 (e.g. plurality of sensors of the first sensor arrangement 106 and the second sensor arrangement 108), and to determine the stress values under the bond pad 102 based on the collected data.

For a densely populated design, routing of the sensors can be a challenge. A data processing unit (which may be also termed as data acquisition system) 100 may require sufficient channels (one for each sensor) to carry out the measurements. An integrated circuit design may be used such that the required calculations are computed on the chip (e.g. including the first sensor arrangement 106 and/or the second sensor arrangement 108) with the resulting four components of stress ($\sigma_x$, $\sigma_y$, $\sigma_z$, $\sigma_{xy}$) being transmitted to the data processing unit 100 (e.g. computer). The transmission of the information e.g. four components of stress ($\sigma_s$, $\sigma_y$, $\sigma_z$, $\sigma_{xy}$) from the chip to the data processing unit 100 may be wired or wireless.

Figure 2:
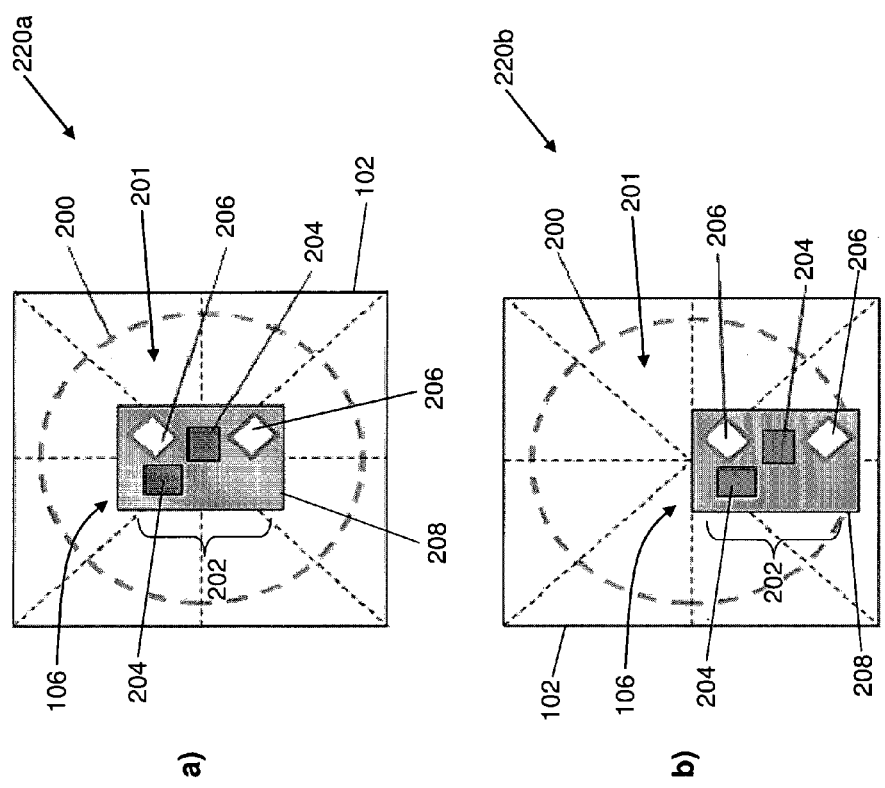
FIG. 2 shows a schematic diagram of a first sensor arrangement of a bonding stress testing arrangement according to one embodiment.

FIGS. 2a and 2b show a schematic diagram of arrangements 220a, 220b of the first sensor arrangement 106 disposed on the bond pad 102. The first sensor arrangement 106 includes a plurality of sensors 202 disposed on a portion 204 of the bond pad 102. Dotted line 200 indicates the bonding area 201 under the bond pad 102. For illustration purposes, only four sensors 202 are shown in FIG. 2. In other embodiments, the number of sensors 202 may be different. In one embodiment, the plurality of sensors 202 may be silicon-based piezoresistive stress sensors or resistors. The plurality of sensors 202 includes sensors of a first polarity 204 and sensors of a second polarity 206. In one embodiment, the number of sensors of the first polarity 204 and the number of sensors of the second polarity 206 may be the same. In another embodiment, the number of sensors of the first polarity 204 and the number of sensors of the second polarity 206 may be different. In one embodiment, the first polarity is n-type conductivity and the second polarity is p-type conductivity. In another embodiment, the first polarity is p-type conductivity and the second polarity is n-type conductivity.

Figure 3A:
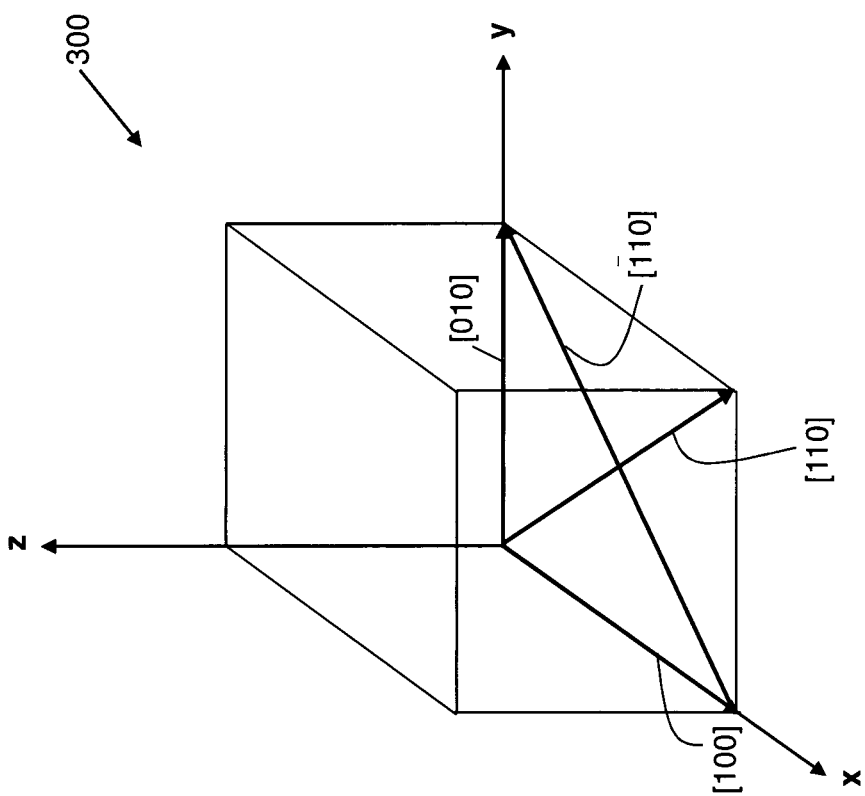
FIG. 3a shows a three-dimension schematic diagram of the crystal directions according to one embodiment.

The plurality of sensors 202 is arranged such that the sensor of the first polarity 204 is placed adjacent to the sensor of the second polarity 206. Each of the plurality of sensors 202 is oriented or arranged along a different crystal direction. One sensor 202 is oriented or arranged along a crystal direction of [110] as illustrated in FIG. 3a which shows a three-dimension schematic diagram 300 of the crystal directions. Each crystal direction has a form of [abc]. The first entry 'a' of the crystal direction [abc] is a component of the crystal direction along the x-axis. The second entry 'b' of the crystal direction [abc] is a component of the crystal direction along the y-axis. The third entry 'c' of the crystal direction [abc] is a component of the crystal direction along the z-axis. Each sensor 202 is displaced 45° from the adjacent sensor 202.

The plurality of sensors 202 may be used to determine the four components of stress ($\sigma_x$, $\sigma_y$, $\sigma_z$, $\sigma_{xy}$). Each sensor 202 is adapted to measure a respective component of stresss ($\sigma_x$, $\sigma_y$, $\sigma_z$, $\sigma_{xy}$). The first sensor arrangement 106 is adapted to measure an average stress under the portion 208 of the bond pad 102 covered by the plurality of sensors 202 based on the respective components of stress measured by the plurality of sensors 202. The stress measured is averaged over the entire area (boxed region) (e.g. portion 208 of the bond pad 102) of the sensors 202. The sensors 202 can be placed at the center and/or sides and/or any other location in the bond pad 102 as shown in FIGS. 2a and 2b. An average bulk stress at the location where the sensors 202 are placed the bond pad 102 can be determined.

Figure 3B:
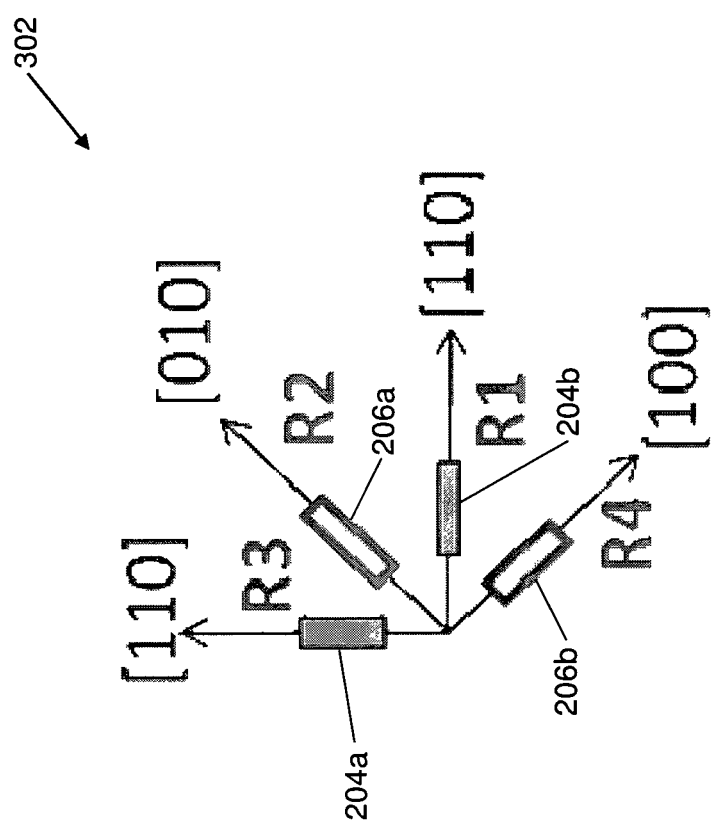
FIG. 3b shows a schematic diagram of an arrangement of sensors of a first sensor arrangement of a bonding stress testing arrangement according to one embodiment.

In one embodiment, the plurality of sensors 202 may include four sensors 202—two sensors of the first polarity 204a, 204b and two sensors of the second polarity 206a, 206b. In one embodiment, the first polarity is n-type conductivity and the second polarity is p-type conductivity. In another embodiment, the first polarity is p-type conductivity and the second polarity is n-type conductivity. FIG. 3b shows a schematic diagram of an arrangement 302 of sensors 202 of the first sensor arrangement 106. As shown in FIG. 3b and with reference to FIG. 3a, a first sensor of the first polarity 204a is oriented along a crystal direction of [110] (e.g. [−110]). A first sensor of the second polarity 206a is placed adjacent to the first sensor of the first polarity 204a and is displaced 45° from the first sensor of the first polarity 204a. The first sensor of the second polarity 206a is oriented along a crystal direction of [010]. A second sensor of the first polarity 204b is placed adjacent to the first sensor of the second polarity 206a and is displaced 45° from the first sensor of the second polarity 206a. The second sensor of the first polarity 204b is oriented along a crystal direction of [110]. A second sensor of the second polarity 206b is placed adjacent to the second sensor of the first polarity 204b and is displaced 45° from the second sensor of the first polarity 204b. The second sensor of the second polarity 206b is oriented along a crystal direction of [100]. Each sensor 204a, 204b, 206a, 206b may measure a respective component of stress ($\sigma_x$, $\sigma_y$, $\sigma_z$, $\sigma_{xy}$). In one embodiment, each sensor 204a, 204b, 206a, 206b may have a respective resistance. The resistance of each sensor 204a, 204b, 206a, 206b may change due to stresses detected. A change in the resistance $$\frac{\Delta R}{R}$$

of each sensor 204a, 204b, 206a, 206b can be represented by:

$$\frac{\Delta R}{R} = \frac{R(\sigma, \Delta T) - R(0,0)}{R(0,0)} \quad (1)$$
$$= f(\Delta T) + [\Pi + \beta(\Delta T)]\sigma$$

wherein $R(\sigma, \Delta T)$ is a resistance of the sensor measured when stress is detected and there is a change in temperature, $R(0,0)$ is an initial resistance of the sensor when there is no stress, $f(\Delta T)$ is a temperature coefficient of resistance, $\beta(\Delta T)$ is a temperature coefficient of piezoresistance, $\Pi$ is piezoresistive coefficient, and $\sigma$ is the stress component. $f(\Delta T)$ can be represented by:

$$f(\Delta T) = \sum_N \alpha_N \Delta T^N \quad (2)$$
$$= \alpha_1 \Delta T + \alpha_2 \Delta T^2 + \ldots$$

wherein N is an index of summation, $\sigma_N$ is an Nth coefficient of each term of the polynomial equation, and $\Delta T$ is a change in temperature.

$\beta(\Delta T)$ can be represented by:

$$\beta(\Delta T) = \sum_N \beta_N \Delta T^N = \beta_1 \Delta T + \beta_2 \Delta T^2 + \ldots \quad (3)$$

wherein N is an index of summation, $\beta_N$ is an Nth coefficient of each term of the polynomial equation, and $\Delta T$ is a change in temperature.

Figure 4:
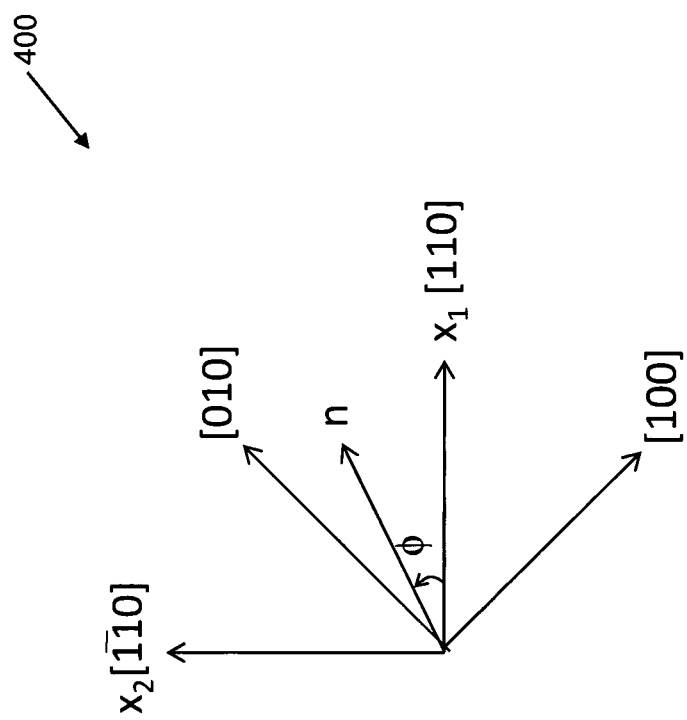
FIG. 4 shows a drawing of crystal directions according to one embodiment.

FIG. 4 shows a drawing 400 of crystal directions of the sensors. With reference to FIG. 4, the change in the resistance $$\frac{\Delta R}{R}$$

of each sensor 204a, 204b, 206a, 206b can also be represented by:

$$\frac{\Delta R}{R} = \left[\left(\frac{\pi_{11} + \pi_{12} + \pi_{44}}{2}\right)\sigma_{11} + \left(\frac{\pi_{11} + \pi_{12} + \pi_{44}}{2}\right)\sigma_{22}\right]l^2 + \quad (4)$$
$$\left[\left(\frac{\pi_{11} + \pi_{12} + \pi_{44}}{2}\right)\sigma_{11} + \left(\frac{\pi_{11} + \pi_{12} + \pi_{44}}{2}\right)\sigma_{22}\right]m^2 +$$
$$\pi_{12}\sigma_{33} + 2(\pi_{11} - \pi_{12})\sigma_{12}lm$$
$$= \Pi\sigma$$

where $\pi_{11}$, $\pi_{12}$, $\pi_{44}$ are piezoresistive coefficients, $\sigma_{11}$, $\sigma_{12}$, $\sigma_{22}$, $\sigma_{33}$ are stress components, $l=\cos\phi$, $m=\sin\phi$, $\Pi$ is piezoresistive coefficient, and $\sigma$ is a stress component.

In more detail, the change in the resistance $$\frac{\Delta R}{R}$$

of the first sensor of the first polarity 204a can be represented by:

$$\frac{\Delta R}{R_{10}} = \left(\frac{\pi_{11}^n + \pi_{12}^n + \pi_{44}^n}{2}\right)\sigma_x + \left(\frac{\pi_{11}^n + \pi_{12}^n + \pi_{44}^n}{2}\right)\sigma_y + \pi_{12}^n\sigma_z \quad (5)$$

wherein $\pi_{11}^a$, $\pi_{12}^a$, $\pi_{44}^n$ are piezoresistive coefficients, $\sigma_x$, $\sigma_y$, $\sigma_z$, are normal stress components, and n indicates that $\pi_{11}^a$, $\pi_{12}^n$, $\pi_{44}^n$ are piezoresistive coefficients for a sensor of n-type conductivity.

The change in the resistance $$\frac{\Delta R}{R}$$

of the first sensor of the second polarity 206a can be represented by:

$$\frac{\Delta R_2}{R_{20}} = \left(\frac{\pi_{11}^P + \pi_{12}^P}{2}\right)(\sigma_x + \sigma_y) + \pi_{12}^P \sigma_z + (\pi_{11}^P - \pi_{12}^P)\tau_{xy} \quad (6)$$

wherein $\pi_{11}^P$, $\pi_{12}^P$ are piezoresistive coefficients, $\sigma_x$, $\sigma_y$, $\sigma_z$ are normal stress components, $\tau_{xy}$ is a shear stress component, and p indicates that $\pi_{11}^P$, $\pi_{12}^P$ are piezoresistive coefficients for a sensor of p-type conductivity.

The change in the resistance $$\frac{\Delta R}{R}$$

of the second sensor of the first polarity 204b can be represented by:

$$\frac{\Delta R_3}{R_{30}} = \left(\frac{\pi_{11}^n + \pi_{12}^n + \pi_{44}^n}{2}\right)\sigma_x + \left(\frac{\pi_{11}^n + \pi_{12}^n + \pi_{44}^n}{2}\right)\sigma_y + \pi_{12}^n \sigma_z \quad (7)$$

wherein $\pi_{11}^n$, $\pi_{12}^n$, $\pi_{44}^n$ are piezoresistive coefficients, $\sigma_x$, $\sigma_y$, $\sigma_z$ are normal stress components, and n indicates that $\pi_{11}^n$, $\pi_{12}^n$, $\pi_{44}^n$ are piezoresistive coefficients for a sensor of n-type conductivity.

The change in the resistance $$\frac{\Delta R}{R}$$

of the second sensor of the second polarity 206b can be represented by:

$$\frac{\Delta R_4}{R_{40}} = \left(\frac{\pi_{11}^P + \pi_{12}^P}{2}\right)(\sigma_x + \sigma_y) + \pi_{12}^P \sigma_z - (\pi_{11}^P - \pi_{12}^P)\tau_{xy} \quad (8)$$

wherein $\pi_{11}^P$, $\pi_{12}^P$ are piezoresistive coefficients, $\sigma_x$, $\sigma_y$, $\sigma_z$ are normal stress components, $\tau_{xy}$ is a shear stress component, and p indicates that $\pi_{11}^P$, $\pi_{12}^P$ are piezoresistive coefficients for a sensor of p-type conductivity.

A stress distribution beneath the bond pad 102 may be obtained from the four components of stress ($\sigma_x$, $\sigma_y$, $\sigma_z$, $\sigma_{xy}$) which can be determined based on the above equations (5) to (8).

In one embodiment, four stress sensors 202 arranged in a specific configuration are needed to determine the four stress components ($\sigma_x$, $\sigma_y$, $\sigma_z$, $\sigma_{xy}$) by using the above equations (5) to (8). In short, the four stress components ($\sigma_x$, $\sigma_y$, $\sigma_z$, $\sigma_{xy}$) can be determined by using the above-mentioned four sensors 204a, 204b, 206a, 206b together. One embodiment of the configuration of the four sensors 204a, 204b, 206a, 206b is arranging the first sensor of the first polarity 204a, the first sensor of the second polarity 206a, the second sensor of the first polarity 204b, and the second sensor of the second polarity 206b along the respective crystal directions of [$\overline{1}\overline{1}0$], [010], [110] and [100]. This configuration is chosen based on theory expressed by the above equation (4). In theory, 1 and m are respectively the direction cosine and sine for the orientation of the ith sensor (i=1, 2, 3, 4). Both cos 45° and sin 45° are equal to $\sqrt{2}/2$, and cos 0° is equal to 1. Thus, the four orientations [$\overline{1}\overline{1}0$], [010], [110] and [100] are used. Nevertheless, in other embodiments, it is possible to use other orientations of the first sensor of the first polarity 204a, the first sensor of the second polarity 206a, the second sensor of the first polarity 204b, the second sensor of the second polarity 206b for measuring the four components of stress ($\sigma_x$, $\sigma_y$, $\sigma_z$, $\sigma_{xy}$).

Figure 5:
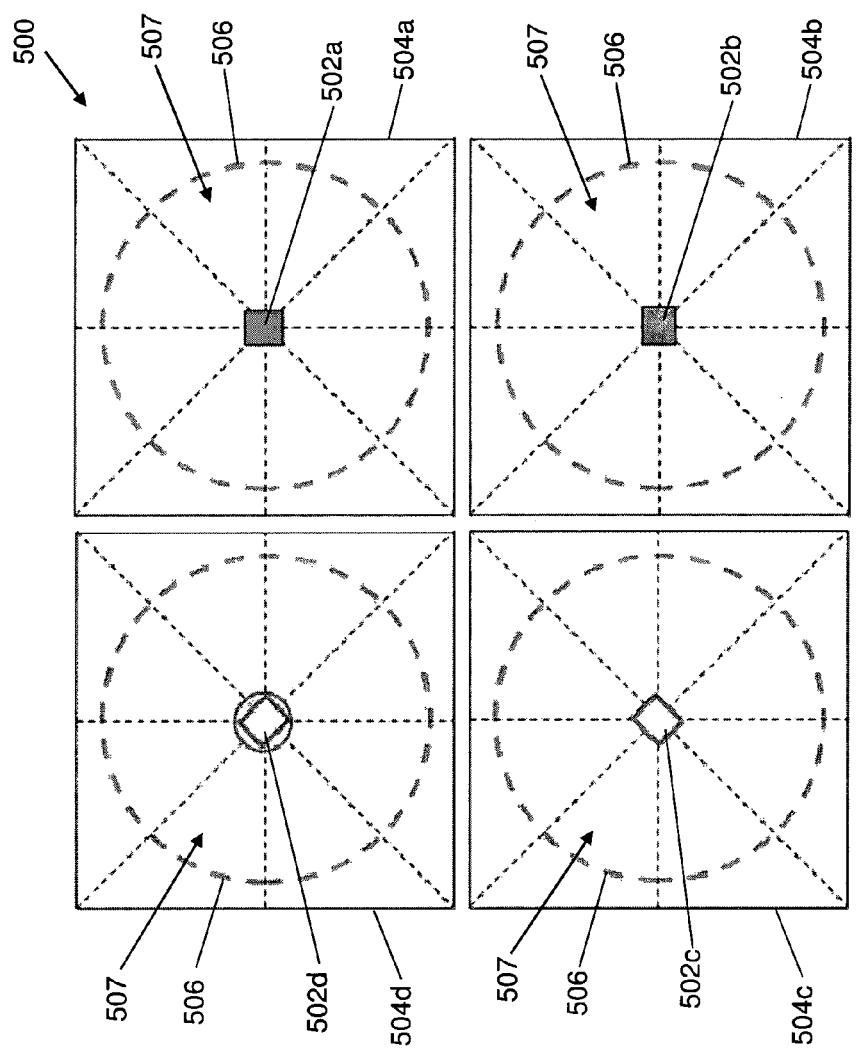
FIG. 5 shows a schematic diagram of a second sensor arrangement of a bonding stress testing arrangement according to one embodiment.

FIG. 5 shows a schematic diagram of a second sensor arrangement 500 according to an embodiment. The second sensor arrangement 500 may correspond to the second sensor arrangement 108 described above. The second sensor arrangement 500 includes a plurality of sensors 502a, 502b, 502c, 502d (e.g. the first sensor 502a, the second sensor 502b, the third sensor 502c and the fourth sensor 502d). For illustration purpose, only four sensors are shown in FIG. 5. In other embodiments, the number of sensors may be different. The plurality of sensors 502a, 502b, 502c, 502d includes sensors of a first polarity 502a, 502b and sensors of a second polarity 502c, 502d. Instead of placing the first sensor 502a, the second sensor 502b, the third sensor 502c, and the fourth sensor 502d on a same bond pad, the first sensor 502a, the second sensor 502b, the third sensor 502c, and the fourth sensor 502d are separated onto different bond pads 504a, 504b, 504c, 504d respectively. The first sensor 502a, the second sensor 502b, the third sensor 502c, and the fourth sensor 502d are disposed on a first bond pad 504a, a second bond pad 504b, a third bond pad 504c, and a fourth bond pad 504d respectively. Such an arrangement can help to save space taken up by the first sensor 502a, the second sensor 502b, the third sensor 502c, the fourth sensor 502d on the respective first bond pad 504a, second bond pad 504b, third bond pad 504c, and fourth bond pad 504d.

The first sensor 502a, the second sensor 502b, the third sensor 502c, and the fourth sensor 502d are oriented along a different crystal direction. The first sensor 502a is oriented along a crystal direction of [$\overline{1}\overline{1}0$]. The second sensor 502b is oriented along a crystal direction of [110]. The third sensor 502c is oriented along a crystal direction of [010]. The fourth sensor 502d is oriented along a crystal direction of [100]. As can be seen from FIG. 5, the orthogonal sensors are of the same polarity. The first sensor 502a and the second sensor 502b are orthogonal, and the third sensor 502c and the fourth sensor 502d are orthogonal. In one embodiment, the first sensor 502a and the second sensor 502b may be of the first polarity, and the third sensor 502c and the fourth sensor 502d may be of the second polarity. In one embodiment, the first polarity is n-type conductivity, and the second polarity is p-type conductivity. In another embodiment, the first polarity is p-type conductivity, and the second polarity is n-type conductivity.

The first sensor 502a, the second sensor 502b, the third sensor 502c, and the fourth sensor 502d are disposed on the same location of the respective first bond pad 504a, second bond pad 504b, third bond pad 504c, and fourth bond pad 504d. For illustration purposes, FIG. 5 shows that the sensors 502a, 502b, 502c, 502d are disposed in the centre of the respective first bond pad 504a, second bond pad 504b, third bond pad 504c, and fourth bond pad 504d. In other embodiments, the sensors 502a, 502b, 502c, 502d may be disposed at the sides and/or any other location of the respective bond pad 504. Dotted line 506 indicates the bonding area 507 under the bond pad 504.

The first sensor 502a, the second sensor 502b, the third sensor 502c, and the fourth sensor 502d are adapted to measure a respective component of stress ($\sigma_x$, $\sigma_y$, $\sigma_z$, $\sigma_{xy}$). The respective component of stress ($\sigma_x$, $\sigma_y$, $\sigma_z$, $\sigma_{xy}$) may be measured by the first sensor 502a, the second sensor 502b, the third sensor 502c, and the fourth sensor 502d during or after wirebonding. It is assumed that the wirebonding carried out at the first bond pad 504a, the second bond pad 504b, the third bond pad 504c, and the fourth bond pad 504d is identical. The second sensor arrangement 500 may determine stress under the locations of the plurality of sensors 502a, 502b, 502c, 502d on the respective first bond pad 504a, second bond pad 504b, third bond pad 504c, and fourth bond pad 504d based on the respective components of stress measured by the plurality of sensors 502a, 502b, 502c, 502d. The four components of stress ($\sigma_x$, $\sigma_y$, $\sigma_z$, $\sigma_{xy}$) at a localized region (e.g. the same location of the first sensor 502a, second sensor 502b, third sensor 502c, fourth sensor 502d on the respective first bond pad 504a, second bond pad 504b, third bond pad 504c, and fourth bond pad 504d) can be determined. In one embodiment, by increasing the number of first sensors 502a, second sensors 502b, third sensors 502c, and fourth sensors 502d on the respective first bond pad 504a, second bond pad 504b, third bond pad 504c, and fourth bond pad 504d, the second sensor arrangement 500 may provide mapping of the stress distribution under the bond pads 504a, 504b, 504c, 504d during wirebonding. The second sensor arrangement 500 may provide a high spatial resolution of the stress distribution mapping.

Figure 6:
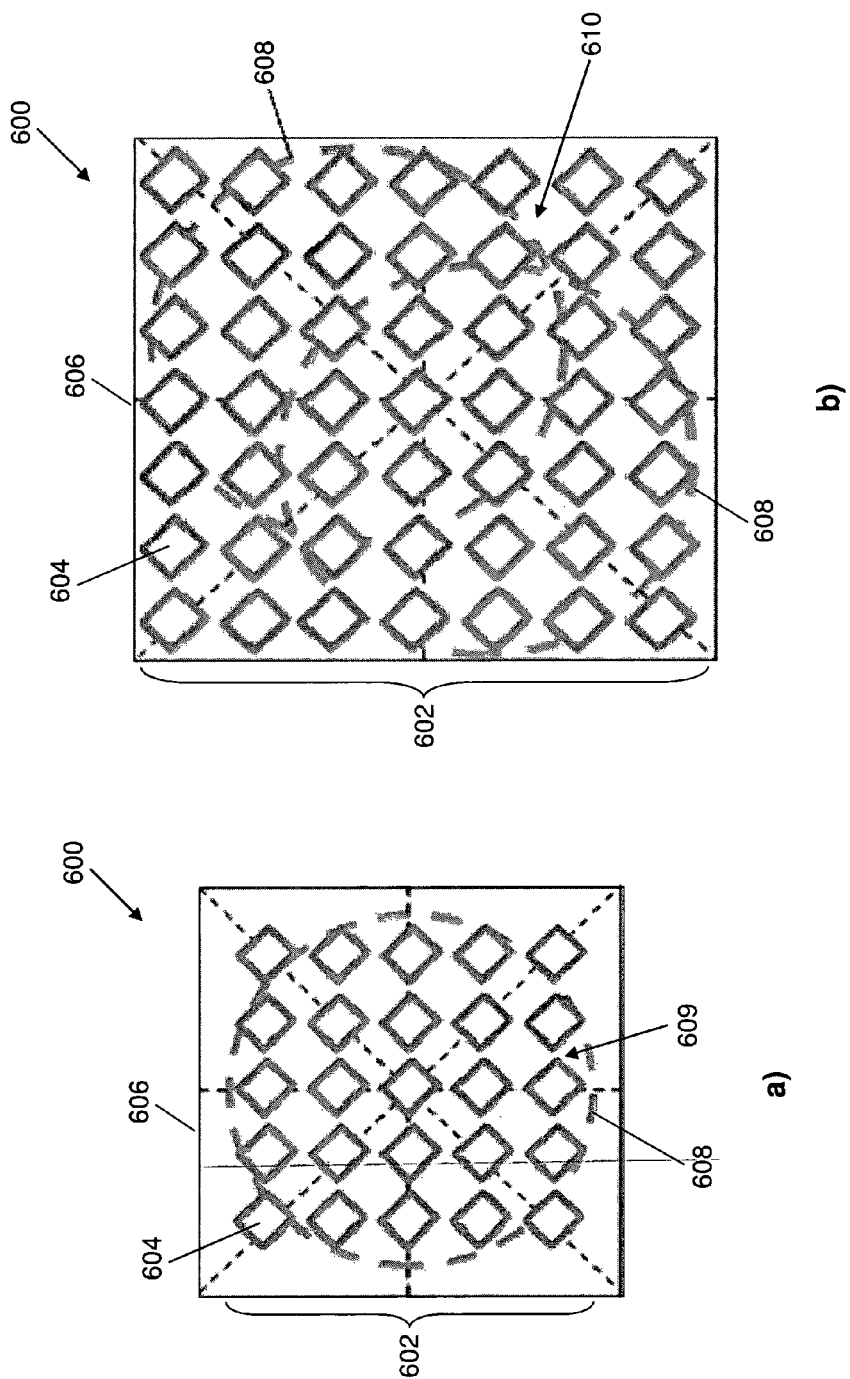
FIG. 6 shows a schematic diagram of a second sensor arrangement of a bonding stress testing arrangement according to one embodiment.

FIGS. 6a and 6b show schematic diagrams of a second sensor arrangement 600. The second sensor arrangement 600 may correspond to the second sensor arrangement 108 described above. The second sensor arrangement 600 includes a plurality of arrays 602 of sensors 604. For illustration purposes, only one array 602 of sensors 604 is shown in FIG. 6. Each array 602 of sensors 604 is disposed on a respective bond pad 606 such that each array 602 of sensors 604 covers a portion of or an entire area of the respective bond pad 606. Dotted line 608 indicates the bonding area 609 under the bond pad 606. In one embodiment, as shown in FIG. 6a, each array 602 of sensors 604 covers the entire bonding area 609 under the respective bond pad 606. In other words, each array 602 of sensors 604 covers the area indicated by the dotted line 608 on the respective bond pad 606. In another embodiment, as shown in FIG. 6b, each array 602 of sensors 604 covers the entire area 610 of the respective bond pad 606. The entire area 610 of the respective bond pad 606 includes the entire bonding area 609 (e.g. the area indicated by the dotted line 608) and the area outside the entire bonding area 609. Arranging each array 602 of sensors 604 to cover the entire area 610 of the respective bond pad 606 can tolerate positioning inaccuracies during wirebonding, e.g. can decrease the need for bonding accuracy.

The plurality of arrays 602 of sensors 604 includes arrays 602 of sensors 604 of a first polarity and arrays 602 of sensors 604 of a second polarity. In one embodiment, the first polarity is n-type conductivity, and the second polarity is p-type conductivity. In another embodiment, the first polarity is p-type conductivity, and the second polarity is n-type conductivity. Each array 602 of sensors 604 is oriented along a different crystal direction. The sensors 604 of each array 602 have the same polarity and are oriented along a same crystal direction.

Figure 7:
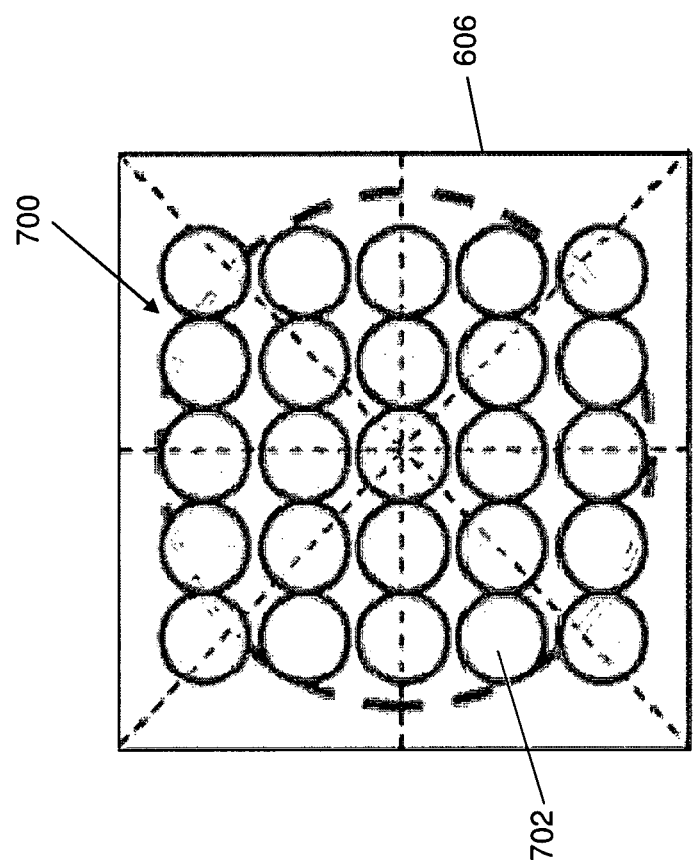
FIG. 7 shows a schematic diagram of a second sensor arrangement of a bonding stress testing arrangement according to one embodiment.

The sensors 604 of the array 602 shown in FIG. 6 have the same second polarity (e.g. p-type conductivity) and are oriented along a same crystal direction of [100]. The illustrated array 602 of sensors 604 may be termed as the first array 602 of sensors 604 of the second sensor arrangement 600. In order to obtain the measurements required, three other bond pads 606 with sensors 604 oriented along the three other orientations [$\overline{1}10$], [010], [110] are required. FIG. 7 shows a schematic diagram of twenty locations 702 under the bond pad 606 for a complete mapping 700 of the stress distribution. To obtain the complete mapping 700 of the stress distribution, the second sensor arrangement 600 may require four different bond pad structures 606 (one for each of the four orientations) and four wirebonds (one on each bond pad 606).

Therefore, the second sensor arrangement 600 may include a second array 602 of sensors 604, a third array 602 of sensors 604 and a fourth array 602 of sensors 604 disposed on different bond pads 606 (not shown). The second array 602 of sensors 604, the third array 602 of sensors 604 and the fourth array 602 of sensors 604 are disposed on the respective bond pads 606. The sensors 604 of the second array 602 may have the same first polarity (e.g. n-type conductivity) and may be oriented along a same crystal direction of [$\overline{1}10$]. The sensors 604 of the third array 602 may have the same second polarity (e.g. p-type conductivity) and may be oriented along a same crystal direction of [010]. The sensors 604 of the fourth array 602 may have the same first polarity (e.g. n-type conductivity) and may be oriented along a same crystal direction of [110].

Each array 602 of sensors 604 has a same number of sensors 604. Depending on the entire area 610 of the bond pad 606 or on the bonding area 609 under the bond pad 606, the number of sensors 604 of each array 602 may vary. As an example, each array 602 has twenty sensors 604 to determine the stress distribution over the bonding area 609 under the bond pad 606 as shown in FIG. 6a, and each array 602 has forty nine sensors 604 to determine the stress distribution under the entire bond pad area 610 as shown in FIG. 6b.

Each array 602 of sensors 604 is adapted to measure a respective component of stress ($\sigma_x$, $\sigma_y$, $\sigma_z$, $\sigma_{xy}$). The second sensor arrangement 600 is adapted to determine stress distribution under the area of the bond pad 606 covered by the plurality of arrays 602 of sensors 604 based on the respective components of stress measured by the plurality of arrays 602 of sensors 604.

Figure 8:
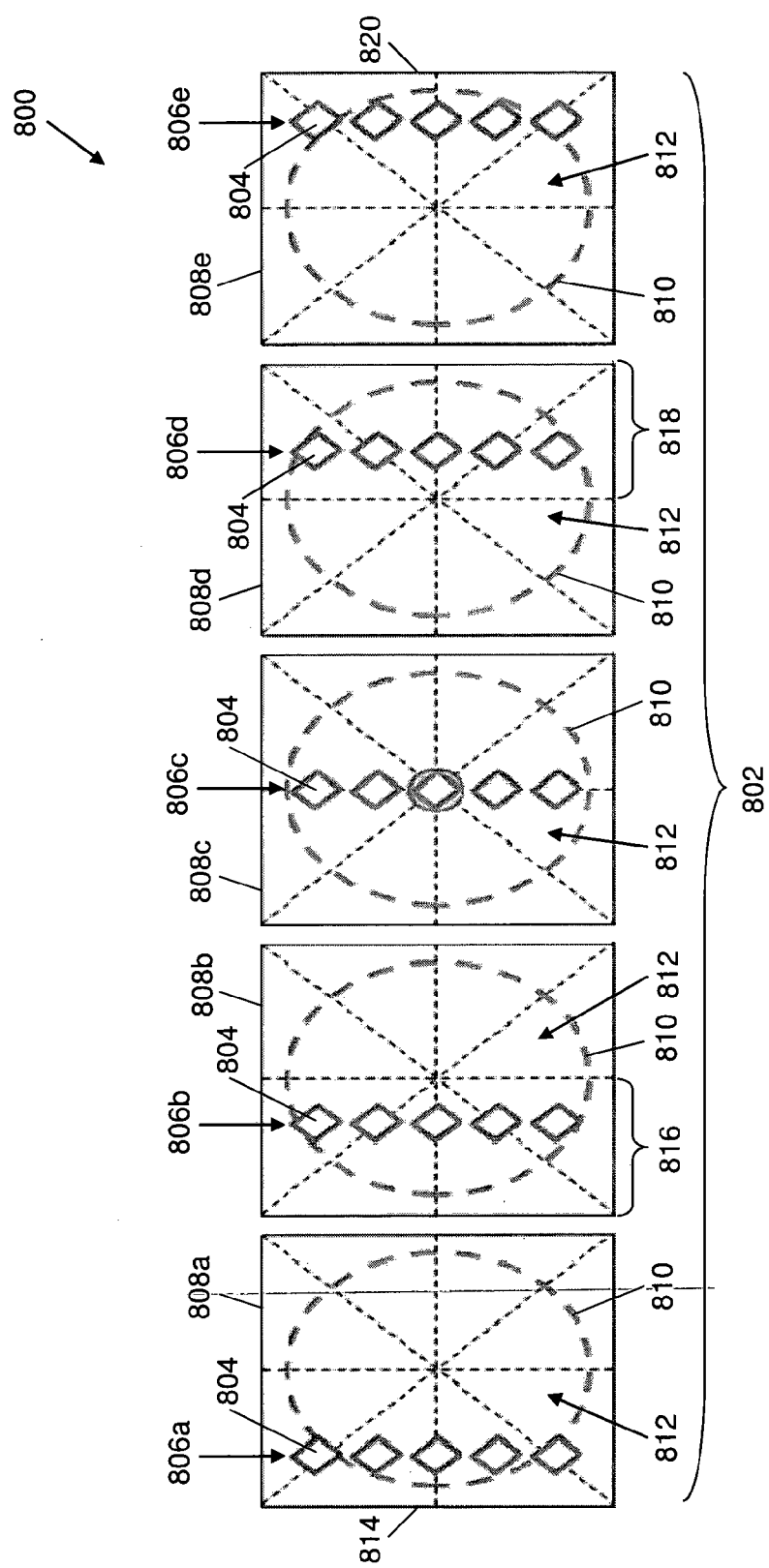
FIG. 8 shows a schematic diagram of a second sensor arrangement of a bonding stress testing arrangement according to one embodiment.

FIG. 8 shows a schematic diagram of a second sensor arrangement 800. The second sensor arrangement 800 may correspond to the second sensor arrangement 108 described above. The second sensor arrangement 800 includes a plurality of groups 802 of sensors 804. For illustration purposes, only one group 802 of sensors 804 is shown in FIG. 8. Each group 802 of sensors 804 is oriented along a different crystal direction. The sensors 804 of each group 802 have the same polarity and are oriented along a same crystal direction. The plurality of groups 802 of sensors 804 comprises groups 802 of sensors 804 of a first polarity and groups 802 of sensors 804 of a second polarity. In one embodiment, the first polarity is n-type conductivity and the second polarity is p-type conductivity. In another embodiment, the first polarity is p-type conductivity and the second polarity is n-type conductivity.

Each group 802 of sensors 804 includes a plurality of series 806 of sensors 804. Each group 802 of sensors 804 has the same number of series 806 of sensors 804. Each series 806 of sensors 804 has the same number of sensors 804. Each series 806 of sensors 804 is disposed on a respective first bond pad 808a, second bond pad 808b, third bond pad 808c, fourth bond pad 808d, and fifth bond pad 808e. Each series 806 of sensors 804 is disposed on a different portion of the respective first bond pad 808a, second bond pad 808b, third bond pad 808c, fourth bond pad 808d, and fifth bond pad 808e. Each series 806 of sensors 804 may be arranged in a row or in a column on the respective first bond pad 808a, second bond pad 808b, third bond pad 808c, fourth bond pad 808d, and fifth bond pad 808e. Dotted line 810 on each of the first bond pad 808a, second bond pad 808b, third bond pad 808c, fourth bond pad 808d, and fifth bond pad 808e indicates the bonding area 812 under the first bond pad 808a, the second bond pad 808b, the third bond pad 808c, the fourth bond pad 808d, and the fifth bond pad 808e.

The group 802 of sensors 804 shown in FIG. 8 is oriented along a crystal direction of [100]. The sensors 804 of the group 802 have the same second polarity (e.g. p-type conductivity). The group 802 of sensors 804 shown in FIG. 8 includes five series 806a, 806b, 806c, 806d, 806e of sensors 804. Each of the first series 806a of sensors 804, the second series 806b of sensors 804, the third series 806c of sensors 804, the fourth series 806d of sensors 804, and the fifth series 806e of sensors 804 has five sensors 804. In other embodiments, the number of series 806 of sensors 804 and the number of sensors 804 for each series 806 may be different. Each of the first series 806a of sensors 804, the second series 806b of sensors 804, the third series 806c of sensors 804, the fourth series 806d of sensors 804, and the fifth series 806e of sensors 804 is disposed on a different portion of the respective first bond pad 808a, second bond pad 808b, third bond pad 808c, fourth bond pad 808d, and fifth bond pad 808e. A first series 806a of sensors 804 is disposed near a left edge 814 of the first bond pad 808a. A second series 806b of sensors 804 is disposed in the middle of the left half 816 of the second bond pad 808b. A third series 806c of sensors 804 is disposed in the centre of the third bond pad 808c. A fourth series 806d of sensors 804 is disposed in the middle of the right half 818 of the fourth bond pad 808d. A fifth series 806e of sensors 804 is disposed near a right edge 820 of the fifth bond pad 808e. In other words, the position of each of the first series 806a of sensors 804, the second series 806b of sensors 804, the third series 806c of sensors 804, the fourth series 806d of sensors 804, and the fifth series 806e of sensors 804 is offset from one another on the respective first bond pad 808a, second bond pad 808b, third bond pad 808c, fourth bond pad 808d, and fifth bond pad 808e.

To obtain the respective components of stress ($\sigma_x$, $\sigma_y$, $\sigma_z$, $\sigma_{xy}$), the second sensor arrangement 800 may require three other groups 802 of sensors 804 oriented along three other orientations [$\overline{1}10$], [010], [110]. The second sensor arrangement 800 may further include a group 802 of sensors 804 oriented along a crystal direction of [$\overline{1}10$], a group 802 of sensors 804 oriented along a crystal direction of [010], and a group 802 of sensors 804 oriented along a crystal direction of [110] (not shown). In one embodiment, the group 802 of sensors 804 oriented along the crystal direction of [110] and the group 802 of sensors 804 oriented along the crystal direction of [110] may be of the first polarity (e.g. n-type conductivity). The group 802 of sensors 804 oriented along the crystal direction of [010] may be of the second polarity (e.g. p-type conductivity). Each of these groups 802 of sensors 804 has the same number of series 806 of sensors 804 (e.g. five series 806 of sensors 804). Each series 806 of sensors 804 of each group 802 has the same number of sensors 804 (e.g. five sensors 804). Since each series 806 of sensors 804 of each group 802 is disposed on a respective bond pad 808, the second sensor arrangement 800 may include fifteen more bond pads 808.

In one embodiment, considering that the second sensor arrangement 800 has four groups 802 of sensors 804 and each group 802 of sensors 804 has five series 806 of sensors 804, the second sensor arrangement 800 may require twenty bond pad structures 808 (5 positions×4 orientations) and twenty wirebonds (one on each pad 808) for a complete mapping of the bond pad area e.g. as shown in FIG. 7.

The corresponding first series 806a of sensors 804, second series 806b of sensors 804, third series 806c of sensors 804, fourth series 806d of sensors 804, and fifth series 806e of sensors 804 of each group 802 is disposed on the same portion of the respective first bond pad 808a, second bond pad 808b, third bond pad 808c, fourth bond pad 808d, and fifth bond pad 808e. That is, the first series 806a of sensors 804 of each group 802 is disposed near a left edge 814 of the respective first bond pad 808a. The second series 806b of sensors 804 of each group 802 is disposed in the middle of the left half 816 of the respective second bond pad 808b. The third series 806c of sensors 804 of each group 802 is disposed in the centre of the respective third bond pad 808c. The fourth series 806d of sensors 804 of each group 802 is disposed in the middle of the right half 818 of the respective fourth bond pad 808d. The fifth series 806e of sensors 804 of each group 802 is disposed near a right edge 820 of the respective fifth bond pad 808e. The corresponding first series 806a of sensors 804, second series 806b of sensors 804, third series 806c of sensors 804, fourth series 806d of sensors 804, and fifth series 806e of sensors 804 of each group 802 can measure a respective component of stress ($\sigma_x$, $\sigma_y$, $\sigma_z$, $\sigma_{xy}$) under the same portion of the bonding area 812 under the respective first bond pad 808a, second bond pad 808b, third bond pad 808c, fourth bond pad 808d, and fifth bond pad 808e. As such, the stress components ($\sigma_x$, $\sigma_x$, $\sigma_z$, $\sigma_{xy}$) under a portion of the bonding area 812 of the first bond pad 808a, the second bond pad 808b, the third bond pad 808c, the fourth bond pad 808d, and the fifth bond pad 808e covered by the corresponding first series 806a of sensors 804, second series 806b of sensors 804, third series 806c of sensors 804, fourth series 806d of sensors 804, and fifth series 806e of each group 802 can be determined. A stress distribution under a portion of the bonding area 812 of the first bond pad 808a, the second bond pad 808b, the third bond pad 808c, the fourth bond pad 808d, and the fifth bond pad 808e can be determined.

Each group 802 of sensors 804 is adapted to measure a respective component of stress ($\sigma_x$, $\sigma_y$, $\sigma_z$, $\sigma_{xy}$). Each group 802 of sensors 804 may determine a respective component of stress ($\sigma_x$, $\sigma_y$, $\sigma_z$, $\sigma_{xy}$) under the area of one bond pad 808 based on the respective component of stress ($\sigma_x$, $\sigma_y$, $\sigma_z$, $\sigma_{xy}$) measured by each of the first series 806a of sensors 804, the second series 806b of sensors 804, the third series 806c of sensors 804, the fourth series 806d of sensors 804, and the fifth series 806e of sensors 804 of the group 802 under a respective portion of the area of the first bond pad 808a, the second bond pad 808b, the third bond pad 808c, the fourth bond pad 808d, and the fifth bond pad 808e. The second sensor arrangement 800 is adapted to determine stress distribution under the area of the bond pad 808 covered by the plurality of groups 802 of sensors 804 based on the respective components of stress measured by the plurality of groups 802 of sensors 804.

Figure 9:
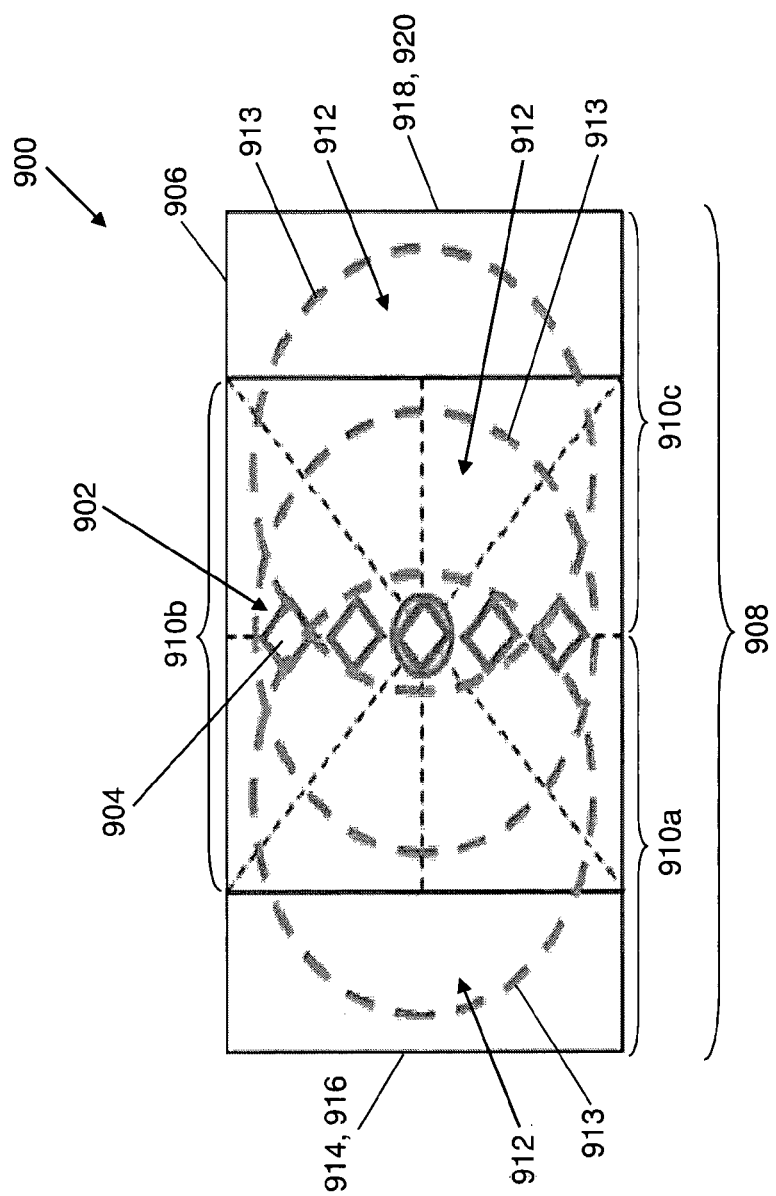
FIG. 9 shows a schematic diagram of a second sensor arrangement of a bonding stress testing arrangement according to one embodiment.

FIG. 9 shows a schematic diagram of a second sensor arrangement 900. The second sensor arrangement 900 may correspond to the second sensor arrangement 108 described above. The second sensor arrangement 900 includes a plurality of series 902 of sensors 904 and a plurality of bond pads 906. For illustration purposes, only one series 902 of sensors 904 and one bond pad 906 is shown. Each series 902 of sensors 904 is disposed in the centre of a corresponding bond pad 906 of the plurality of bond pads 906.

The plurality of series 902 of sensors 904 comprises series 902 of sensors 904 of a first polarity and series 902 of sensors 904 of a second polarity. In one embodiment, the first polarity is n-type conductivity and the second polarity is p-type conductivity. In another embodiment, the first polarity is p-type conductivity and the second polarity is n-type conductivity. Each series 902 of sensors 904 is oriented along a different crystal direction. The sensors 904 of each series 902 have the same polarity and are oriented along a same crystal direction. Each series 902 of sensors 904 has the same number of sensors 904.

Each bond pad 906 includes a group 908 of bond segments 910a, 910b, 910c. For illustration purposes, only three bond segments 910a, 910b, 910c (the first bond segment 910a, the second bond segment 910b, the third bond segment 910c) are shown in FIG. 9. Each group 908 of bond segments 910a, 910b, 910c is disposed on a corresponding bond pad 906. The bond segments 910a, 910b, 910c of each group 908 respectively have a bonding area 912 disposed at a different region of the corresponding bond pad 906. The bonding area 912 is indicated by dotted line 913. Each group 908 of bond segments 910a, 910b, 910c has the same number of bond segments 910a, 910b, 910c. Each bond pad 906 has a larger size than each bond segment 910a, 910b, 910c.

The sensors 904 of the series 902 have the same second polarity (e.g. p-type conductivity) and are oriented along a same crystal direction of [100]. The series 902 of sensors 904 has five sensors 904. In other embodiments, the series 902 of sensors 904 may have different number of sensors 904. The series 902 of sensors 904 is disposed in the centre of the bond pad 906. The group 908 of bond segments 910a, 910b, 910c is disposed on the bond pad 906. The group 908 of bond segments 910a, 910b, 910c as shown in FIG. 9 has three bond segments 910a, 910b, 910c. In other embodiments, the group 908 of bond segments 910 may have different number of bond segments 910. The first bond segment 910a, the second bond segment 910b, and the third bond segment 910c respectively have a bonding area 912 disposed at a different region of the bond pad 906 as shown in FIG. 9. The first bond segment 910a is disposed on bond pad 906 such that a left edge 914 of the first bond segment 910a is aligned with a left edge 916 of the bond pad 906. The series 902 of sensors 904 is thus disposed on the right end of the first bond segment 910a. The second bond segment 910b is disposed in the centre of the bond pad 906. The series 902 of sensors 904 is thus disposed in the centre of the second bond segment 910b. The third bond segment 910c is disposed on the bond pad 906 such that a right edge 918 of the third bond segment 910c is aligned with a right edge 920 of the bond pad 906. The series 902 of sensors 904 is thus disposed on the left end of the third bond segment 910c. In other words, the bond pad 906 is enlarged and the positions of the respective bonding areas 912 are offset from one another such that the sensors 904 are positioned on different locations of the respective bonding areas 912.

To obtain the respective components of stress ($\sigma_x$, $\sigma_y$, $\sigma_z$, $\sigma_{xy}$), the second sensor arrangement 900 may require three other bond pads 906 each having a series 902 of sensors 904 oriented along different crystal direction (e.g. [$\bar{1}\bar{1}0$], [010], [110]) and a group 908 of bond segments 910. That is, four different bond pad structures 906 (4 orientations) and twenty wirebonds (one wirebond for each of five positions on each pad 906 assuming that there are five bond segments 910 for each group 908) may be provided for a complete mapping of the bond pad area e.g. as shown in FIG. 7.

Therefore, the second sensor arrangement 900 may include a series of 902 of sensors 904 oriented along a crystal direction of [$\bar{1}\bar{1}0$], a series of 902 of sensors 904 oriented along a crystal direction of [010], and a series of 902 of sensors 904 oriented along a crystal direction of [110]. In one embodiment, the series of 902 of sensors 904 oriented along the crystal direction of [$\bar{1}\bar{1}0$] and the series of 902 of sensors 904 oriented along the crystal direction of [110] may be of the first polarity (e.g. n-type conductivity). The series of 902 of sensors 904 oriented along the crystal direction of [010] may be of the second polarity (e.g. p-type conductivity). Each series 902 of sensors 904 has the same number of sensors 904. Each series 902 of sensors 904 is disposed in the centre of a corresponding bond pad 906. The second sensor arrangement 900 may include three other groups 908 of bond segments 910 disposed on different bond pads. The corresponding bond segment 910 of each group 908 is disposed on the same region of the respective bond pad 906.

Each series 902 of sensors 904 is adapted to measure a respective component of stress ($\sigma_x$, $\sigma_y$, $\sigma_z$, $\sigma_{xy}$). The second sensor arrangement 900 is adapted to determine stress distribution under the area of the bond pad 906 covered by the plurality of series 902 of sensors 904 based on the respective components of stress measured by the plurality of series 902 of sensors 904.

In one embodiment, the plurality of bond pads may include different groups of bond pads. Each group of bond pads may have a bonding area disposed at a different region of the bond pads. Each group of bond pads may have the same number of bond pads. The plurality of series of sensors may have series of sensors of a first polarity and series of sensors of a second polarity. The plurality of series 902 of sensors 904 of the second sensor arrangement 900 may include different groups of series 902 of sensors 904. Each group of series 902 of sensors 904 may be oriented along a different crystal direction. The sensors 904 of each group may have the same polarity and may be oriented along a same crystal direction. Each group of sensors 904 may have the same number of series 902 of sensors 904, and each series 902 of sensors 904 may have the same number of sensors 904. Each group of sensors 904 may be adapted to measure a respective component of stress. The second sensor arrangement 900 may be adapted to determine stress distribution under the area of the bond pad 906 covered by the plurality of groups of sensors 904 based on the respective components of stress measured by the plurality of groups of sensors 904.

The bonding stress testing arrangement according to various embodiments can provide a wirebonding test chip with structures to measure the average stress and to map the stress distribution under the bond pad. Using these structures, the average stress at the center and the sides of the bond pad can be determined. One main advantage of this test chip is that the stresses measured by it cannot be measured using any other conventional methods. The bonding stress testing arrangement according to various embodiments carries out four calibration experiments to determine six piezoresistive coefficients, and requires temperature calibration. The bonding stress testing arrangement according to various embodiments uses p-type sensors which are known to have lower sensitivity and larger variation together with n-type sensors.

Bonding accuracy and uniformity is important for accurate stress measurement. Slight misalignments of 1 to 2 microns due to wirebonding misalignment would not affect accuracy of stress measurement greatly. It may result in the measurement value obtained encompassing a larger circular area than the ones e.g. shown in FIG. 7 and/or overlapping adjacent circles. Using the bonding stress testing arrangement according to various embodiments, the minimum width of sensors which can be fabricated is 0.3 to 0.4 microns. As a result, using an aspect ratio of 10:1, the length of the sensors ranges between 3 to 4 microns. Hence, the stresses are measured over a 3 to 4 micron square. With advances in implantation technology, the sensors may be further miniaturized.

Figure 10:
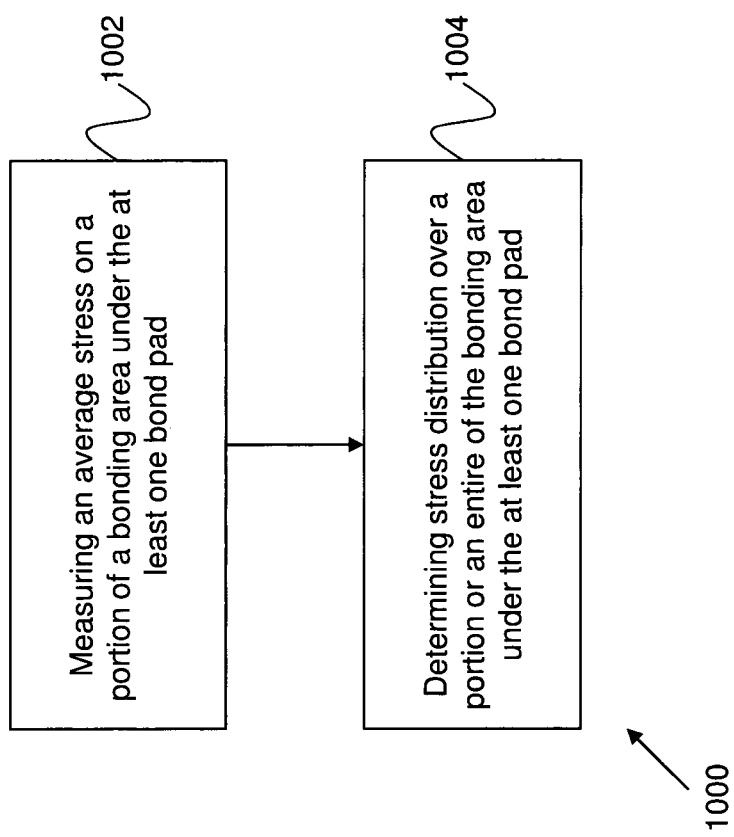
FIG. 10 shows a flowchart of a method of determining stress on a portion of a bonding area under at least one bond pad according to one embodiment.

FIG. 10 shows a flowchart 1000 of a method of determining stress on a portion of a bonding area under at least one bond pad. At 1002, an average stress on a portion of a bonding area under the at least one bond pad is measured. At 1004, stress distribution over a portion or an entire of the bonding area under the at least one bond pad is determined. In one embodiment, an average stress on a portion of a bonding area under the at least one bond pad can be measured without determining stress distribution over a portion or an entire of the bonding area under the at least one bond pad. In another embodiment, stress distribution over a portion or an entire of the bonding area under the at least one bond pad can be determined without measuring an average stress on a portion of a bonding area under the at least one bond pad.

In one embodiment, measuring an average stress on a portion of a bonding area under the at least one bond pad may include evaluating measurements of a plurality of sensors disposed on a portion of the bond pad. The plurality of sensors may include sensors of a first polarity and sensors of a second polarity. Measuring an average stress on a portion of a bonding area under the at least one bond pad may further include evaluating the measurements of the plurality of sensors arranged such that the sensor of a first polarity is placed adjacent to the sensor of a second polarity. Measuring an average stress on a portion of a bonding area under the at least one bond pad may further include evaluating the measurement of each of the plurality of sensors arranged along a different crystal direction. Measuring an average stress on a portion of a bonding area under the at least one bond pad may further include evaluating the measurement of one sensor arranged along a crystal direction of [110]. Measuring an average stress on a portion of a bonding area under the at least one bond pad may further include evaluating the measurement of each sensor displaced 45° from the adjacent sensor. Each sensor may measure a respective component of stress. Measuring an average stress on a portion of a bonding area under the at least one bond pad may further include measuring an average stress under the portion of the bond pad covered by the plurality of sensors based on the respective components of stress measured by the plurality of sensors.

In one embodiment, determining stress distribution over a portion or an entire of the bonding area under the at least one bond pad may include evaluating measurement of each of a plurality of sensors disposed on a respective bond pad and arranged along a different crystal direction. The plurality of sensors may include sensors of a first polarity and sensors of a second polarity. Determining stress distribution over a portion or an entire of the bonding area under the at least one bond pad may further include evaluating the measurement of each sensor disposed on the same location of the respective bond pad. Each sensor may measure a respective component of stress. Determining stress distribution over a portion or an entire of the bonding area under the at least one bond pad may further include determining stress under the location of the plurality of sensors on the respective bond pads based on the respective components of stress measured by the plurality of sensors.

In one embodiment, determining stress distribution over a portion or an entire of the bonding area under the at least one bond pad may include evaluating measurements of each of a plurality of arrays of sensors disposed on a respective bond pad such that each array of sensors covers a portion of or an entire area of the respective bond pad. Each array of sensors may cover the entire bonding area under the respective bond pad. The plurality of arrays of sensors may include arrays of sensors of a first polarity and arrays of sensors of a second polarity. Determining stress distribution over a portion or an entire of the bonding area under the at least one bond pad may further include evaluating the measurements of each array of sensors arranged along a different crystal direction. The sensors of each array may have the same polarity and are arranged along a same crystal direction. Each array of sensors may include a same number of sensors. Each array of sensors may measure a respective component of stress. Determining stress distribution over a portion or an entire of the bonding area under the at least one bond pad may further include determining stress distribution under the area of the bond pad covered by the plurality of arrays of sensors based on the respective components of stress measured by the plurality of arrays of sensors.

In one embodiment, determining stress distribution over a portion or an entire of the bonding area under the at least one bond pad may include evaluating measurements of each of a plurality of groups of sensors arranged along a different crystal direction. Each group of sensors may include a plurality of series of sensors. Determining stress distribution over a portion or an entire of the bonding area under the at least one bond pad may further include evaluating the measurements of each series of sensors disposed on a different portion of a respective bond pad. Determining stress distribution over a portion or an entire of the bonding area under the at least one bond pad may further include evaluating the measurements of the corresponding series of sensors of each group disposed on the same portion of the respective bond pad. The plurality of groups of sensors may include groups of sensors of a first polarity and groups of sensors of a second polarity. Determining stress distribution over a portion or an entire of the bonding area under the at least one bond pad may further include evaluating the measurements of each group of sensors arranged along a different crystal direction. The sensors of each group may have the same polarity and may be arranged along a same crystal direction. Each group of sensors may have the same number of series of sensors, and each series of sensors may have the same number of sensors. Each group of sensors may measure a respective component of stress. Determining stress distribution over a portion or an entire of the bonding area under the at least one bond pad may further include determining stress distribution under the area of the bond pad covered by the plurality of groups of sensors based on the respective components of stress measured by the plurality of groups of sensors.

In one embodiment, determining stress distribution over a portion or an entire of the bonding area under the at least one bond pad may include evaluating measurements of each of a plurality of series of sensors disposed in the centre of a corresponding bond pad of a plurality of bond pads. Each bond pad may include a group of bond segments. Each group of bond segments may have a bonding area disposed at a different region of the corresponding bond pad. Each group of bond segments may have the same number of bond segments. The plurality of series of sensors may include series of sensors of a first polarity and series of sensors of a second polarity. Determining stress distribution over a portion or an entire of the bonding area under the at least one bond pad may further include evaluating the measurements of each series of sensors arranged along a different crystal direction. The sensors of each series may have the same polarity and may be arranged along a same crystal direction. Each series of sensors may have the same number of sensors. Each series of sensors may measure a respective component of stress. Determining stress distribution over a portion or an entire of the bonding area under the at least one bond pad may further include determining stress distribution under the area of the bond pad covered by the plurality of series of sensors based on the respective components of stress measured by the plurality of series of sensors.

In one embodiment, measuring an average stress on a portion of a bonding area under the at least one bond pad may be carried out by a first sensor arrangement. Determining stress distribution over a portion or an entire of the bonding area under the at least one bond pad may be carried out by a second sensor arrangement. The method may include evaluating the measurements of the first sensor arrangement and the second sensor arrangement disposed on the same bond pad or on different bond pads.

The method may further include providing a data processing unit to collect data representing values of the respective components of stress from the plurality of sensors and to determine the stress values under the bond pad based on the collected data.

All the features of the above described bonding stress arrangement are applicable for the method, and all the features of the above described method are applicable for the bonding stress arrangement.

While embodiments of the invention have been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

In this document, the following documents are cited:
[1] Mayer, M., Moon, J. T., Persic, J., "Measuring Stress Next to Au Ball During High Temperature Aging", *Microelectronics Reliability*, Vol. 49, 2009, p 771-781
[2] Shah, A., Lee, J., Mayer, M., Zhou, Y., "Online Methods to Measure Breaking Force of Bonding Wire using a CMOS stress sensor and a proximity sensor", *Sensor and Actuators A: Physical*, Vol. 148, 2008, p 462-471
[3] Shah, A., Mayer, M., Zhou, Y., Hong, S. J., Moon, J. T., "In situ ultrasonic force signals during low-temperature thermosonic copper wire bonding", *Microelectronic Engineering*, Vol. 85, 2008, p 1851-1857
[4] Shah, A., Mayer, M., Zhou, Y., Persic, J., Moon, J. T., "Optimisation of Ultrasound and Bond Force to Reduce Pad Stress in Thermosonic Cu Ball Bonding", *Proceedings 11th Electronics Packaging Technology Conference (EPTC)*, Singapore, 2009.
[5] Mayer, M., Paul, O., Baltes, H., "In-situ Measurement of Stress and Temperature under Bonding Pads During Wire Bonding Using Integrated Microsensors", *Proceedings 2nd Int. Conf Emerging Microelectr. and Intercom. Tech. (EMIT)*, Bangalore, India, 1998. p 129-133

The invention claimed is:

1. A bonding stress testing arrangement, comprising:
at least one bond pad;
a sensor assembly comprising any one of a first sensor arrangement and a combination of the first sensor arrangement and a second sensor arrangement;
wherein the first sensor arrangement is adapted to measure an average stress on a portion of a bonding area under the at least one bond pad, and the second sensor arrangement is adapted to determine stress distribution over a portion or an entire of the bonding area under the at least one bond pad;
wherein the first sensor arrangement comprises a plurality of sensors disposed on a portion of the bond pad;
wherein the plurality of sensors of the first sensor arrangement comprises sensors of a first polarity and sensors of a second polarity disposed on the portion of the bond pad and are arranged such that a sensor of the first polarity is placed adjacent to a sensor of the second polarity and the sensor of the second polarity is placed adjacent to a further sensor of the first polarity;
wherein the first polarity comprises n-type conductivity and the second polarity comprises p-type conductivity, or the first polarity comprises p-type conductivity and the second polarity comprises n-type conductivity.

2. The bonding stress testing arrangement of claim 1, wherein the sensor assembly comprises a combination of the first sensor arrangement and the second sensor arrangement, wherein the first sensor arrangement and the second sensor arrangement are disposed on the same bond pad or on different bond pads.

3. The bonding stress testing arrangement of claim 1, wherein each of the plurality of sensors is oriented along a different crystal direction.

4. The bonding stress testing arrangement of claim 1, wherein each sensor is displaced 45° from the adjacent sensor.

5. The bonding stress testing arrangement of claim 1, wherein each sensor is adapted to measure a respective component of stress.

6. The bonding stress testing arrangement of claim 5, wherein the first sensor arrangement is adapted to measure an average stress under the portion of the bond pad covered by the plurality of sensors based on the respective components of stress measured by the plurality of sensors.

7. The bonding stress testing arrangement of claim 1, wherein the second sensor arrangement comprises a plurality of sensors, each sensor being disposed on a respective bond pad and being oriented along a different crystal direction.

8. The bonding stress testing arrangement of claim 7, wherein the plurality of sensors comprises sensors of a first polarity and sensors of a second polarity.

9. The bonding stress testing arrangement of claim 7, wherein each sensor is disposed on the same location of the respective bond pad and is adapted to measure a respective component of stress.

10. The bonding stress testing arrangement of claim 9, wherein the second sensor arrangement is adapted to determine stress under the location of the plurality of sensors on the respective bond pads based on the respective components of stress measured by the plurality of sensors.

11. The bonding stress testing arrangement of claim 1, wherein the second sensor arrangement comprises a plurality of arrays of sensors, each array of sensors being disposed on a respective bond pad such that each array of sensors covers a portion of or an entire area of the respective bond pad.

12. The bonding stress testing arrangement of claim 11, wherein each array of sensors covers the entire bonding area under the respective bond pad.

13. The bonding stress testing arrangement of claim 11, wherein the plurality of arrays of sensors comprises arrays of sensors of a first polarity and arrays of sensors of a second polarity.

14. The bonding stress testing arrangement of claim 11,
wherein each array of sensors is oriented along a different crystal direction and comprises the same number of sensors;
wherein the sensors of each array have the same polarity and are oriented along a same crystal direction.

15. The bonding stress testing arrangement of claim 11, wherein each array of sensors is adapted to measure a respective component of stress.

16. The bonding stress testing arrangement of claim 15, wherein the second sensor arrangement is adapted to determine stress distribution under the area of the bond pad covered by the plurality of arrays of sensors based on the respective components of stress measured by the plurality of arrays of sensors.

17. The bonding stress testing arrangement of claim 1, wherein the second sensor arrangement comprises a plurality of groups of sensors, each group of sensors being oriented along a different crystal direction.

18. The bonding stress testing arrangement of claim 17,
wherein each group of sensors comprises a plurality of series of sensors, wherein each series of sensors is disposed on a different portion of a respective bond pad;
wherein the corresponding series of sensors of each group is disposed on the same portion of the respective bond pad.

19. The bonding stress testing arrangement of claim 18, wherein each group of sensors has the same number of series of sensors, and each series of sensors has the same number of sensors.

20. The bonding stress testing arrangement of claim 17, wherein the plurality of groups of sensors comprises groups of sensors of a first polarity and groups of sensors of a second polarity.

21. The bonding stress testing arrangement of claim 17,
wherein each group of sensors is oriented along a different crystal direction;
wherein the sensors of each group have the same polarity and are oriented along a same crystal direction.

22. The bonding stress testing arrangement of claim 17, wherein each group of sensors is adapted to measure a respective component of stress.

23. The bonding stress testing arrangement of claim 22, wherein the second sensor arrangement is adapted to determine stress distribution under the area of the bond pad covered by the plurality of groups of sensors based on the respective components of stress measured by the plurality of groups of sensors.

24. The bonding stress testing arrangement of claim 1, wherein the second sensor arrangement comprises a plurality of series of sensors, each series of sensors disposed in the centre of a corresponding bond pad of a plurality of bond pads.

25. The bonding stress testing arrangement of claim 24,
wherein each bond pad comprises a group of bond segments, wherein each group of bond segments has a bonding area disposed at a different region of the corresponding bond pad;
wherein each group of bond segments has the same number of bond segments.

26. The bonding stress testing arrangement of claim 24, wherein the plurality of series of sensors comprises series of sensors of a first polarity and series of sensors of a second polarity.

27. The bonding stress testing arrangement of claim 24,
wherein each series of sensors is oriented along a different crystal direction and has the same number of sensors;
wherein the sensors of each series have the same polarity and are oriented along a same crystal direction.

28. The bonding stress testing arrangement of claim 24, wherein each series of sensors is adapted to measure a respective component of stress.

29. The bonding stress testing arrangement of claim 28, wherein the second sensor arrangement is adapted to determine stress distribution under the area of the bond pad covered by the plurality of series of sensors based on the respective components of stress measured by the plurality of series of sensors.

30. The bonding stress testing arrangement of claim 1, further comprising a data processing unit adapted to collect data representing values of the respective components of stress from the plurality of sensors and to determine the stress values under the bond pad based on the collected data.

31. A method of determining stress on a portion of a bonding area under at least one bond pad, the method comprising:
measuring an average stress on a portion of a bonding area under the at least one bond pad; or
measuring an average stress on a portion of a bonding area under the at least one bond pad, and determining stress distribution over a portion or an entire of the bonding area under the at least one bond pad;
wherein measuring an average stress on a portion of a bonding area under the at least one bond pad comprises evaluating measurements of a plurality of sensors disposed on a portion of the bond pad, wherein the plurality of sensors comprises sensors of a first polarity and sensors of a second polarity;
wherein measuring an average stress on a portion of a bonding area under the at least one bond pad further comprises evaluating the measurements of the plurality of sensors arranged such that a sensor of the first polarity is placed adjacent to a sensor of the second polarity and the sensor of the second polarity is placed adjacent to a further sensor of the first polarity;
wherein the first polarity comprises n-type conductivity and the second polarity comprises p-type conductivity, or the first polarity comprises p-type conductivity and the second polarity comprises n-type conductivity.

* * * * *